United States Patent [19]

Bailey et al.

[11] Patent Number: 4,558,812
[45] Date of Patent: Dec. 17, 1985

[54] METHOD AND APPARATUS FOR BATCH SOLDER BUMPING OF CHIP CARRIERS

[75] Inventors: Alred S. Bailey, Hopewell Township, Mercer County; John R. Fisher, Jr., Hillsborough Township, Somerset County, both of N.J.

[73] Assignee: AT&T Technologies, Inc., Berkeley Heights, N.J.

[21] Appl. No.: 668,973

[22] Filed: Nov. 7, 1984

[51] Int. Cl.[4] ............................................. B23K 31/02
[52] U.S. Cl. .................................. 228/180.1; 228/6.2; 228/47; 228/49.1; 228/221
[58] Field of Search ................. 228/180.1, 180.2, 123, 228/6.2, 47, 49.1, 212, 221, 178, 179

[56] References Cited

U.S. PATENT DOCUMENTS

| | | | |
|---|---|---|---|
| 3,292,240 | 12/1966 | McNutt et al. | 29/155.5 |
| 3,320,658 | 5/1967 | Bolda et al. | 29/155.5 |
| 3,373,481 | 3/1968 | Lins et al. | 29/471.3 |
| 3,719,981 | 3/1973 | Steitz | 29/423 |
| 3,859,723 | 1/1975 | Hamer et al. | 29/626 |
| 4,332,341 | 6/1982 | Minetti | 228/180 A |
| 4,342,090 | 7/1982 | Caccoma et al. | 364/491 |
| 4,364,508 | 12/1982 | Lazzery et al. | 228/106 |
| 4,402,450 | 9/1983 | Abraham et al. | 228/180 A |
| 4,412,642 | 11/1983 | Fisher, Jr. | 228/173 R |
| 4,421,266 | 12/1983 | Bock | 228/180 A |
| 4,462,534 | 7/1984 | Bitaillou et al. | 228/180 A |
| 4,512,509 | 4/1985 | Ellis, Jr. et al. | 228/49.1 |

Primary Examiner—Kuang Y. Lin
Attorney, Agent, or Firm—D. J. Kirk

[57] ABSTRACT

Chip carriers (10—10) are released from an end of a dispensing means (38) drawn across a holder (22) having a plurality of apertures (28—28) therein, to place a carrier in each aperture. Small solder spheres (58—58) are located in a plurality of dimples (56—56) of a planar plate (40) in arrays that are substantially the same as a plurality of bonding pad arrays (18—18) on the bottom surface of a plurality of chip carriers. A vacuum is applied to the holder (22) to hold the chip carriers (10—10) in the apertures (28—28) as the holder rotates to place the bonding pads (18—18) in contact with the solder spheres (68—68). The solder spheres (58—58) are reflowed by applying heat to form a solder "bump" (68) on each pad (18). The chip carriers (10—10) are then cooled and loaded into a plurality of the tubular members (39—39).

8 Claims, 16 Drawing Figures

METHOD AND APPARATUS FOR BATCH SOLDER BUMPING OF CHIP CARRIERS

TECHNICAL FIELD

The present invention relates to a technique for applying solder to electronic circuit packages, and more particularly to a method and apparatus for batch solder bumping of chip carriers.

BACKGROUND OF THE INVENTION

The use of chip carriers for packaging of silicon integrated circuits is the subject of increasing interest in the industry. Typically, a semiconductor chip is bonded to, and sealed within, the chip carrier. Electrically conductive paths connect to the chip, pass through the wall of the carrier and terminate on the bottom thereof as bonding pads or leads. The chip carrier is typically surface bonded to contact pads on a supporting substrate which can be a printed wiring board, a ceramic substrate or the like, including a thick film or thin film circuit.

A convenient method of bonding is by soldering together corresponding contact pads on the carrier and substrate. Solder can be applied to the contact pads by dipping or the like. However, reliable connections usually require a precise solder volume per connection which is not easily obtainable by such methods. In addition, a relatively large gap between the bottom of the carrier and the surface of the substrate is usually required to permit cleaning and encapsulation.

It is well known to bond a chip carrier to the supporting substrate by attaching small spherical solder preforms, often referred to as "solder bumps", to the contact areas of the chip carrier to provide the desired gap. The preforms are then placed in contact with the pads on the supporting substrate and heated to cause the solder to reflow to bond the contact pads to the substrate pads while maintaining a predetermined gap therebetween.

Heretofore, various techniques have been used to handle the small spherical solder bodies. One such technique, described in U.S. Pat. No. 3,320,658 to F. J. Bolda et al., makes use of a hand held vacuum feeder arm capable of sucking up one spherical body at a time and selectively depositing it at preselected locations on a carrier.

One known handling technique capable of increasing the throughput of the aforementioned handling operation is described in U.S. Pat. No. 4,332,341 to R. H. Minetti. That patent discloses the use of a ram head having a pattern of spherical depressions formed therein with the pattern corresponding to the layout of the contact pads of a chip carrier. The ram head is moved downward into a reservoir of spherical bodies of solder, and vacuum is applied to each one of the spherical depressions thereby positioning a spherical body into each depression. The spherical bodies are heated to a temperature below the melting point of the solder and brought into contact with pads of the chip carrier with sufficient mechanical force to produce a bond while the solder is kept in a solid phase.

Although the above-described known techniques are adequate for their respective purposes, there still exists a need for a technique specifically directed to high volume production of bumped chip carriers.

SUMMARY OF THE INVENTION

The instant invention overcomes the foregoing problem with a method of forming solder bumps on contact pads of chip carriers. The method comprises the steps of: dispensing a plurality of chip carriers into an array of cavities of a planar holder; applying a vacuum to hold said carriers in said cavities; positioning the holder, with the chip carriers held therein, proximate to a plate having a plurality of arrays of dimples therein, each dimple containing a solder preform; releasing the vacuum to place each of the pads in contact with one of the solder preforms; and heating the preforms to form a solder bump on each pad.

DETAILED DESCRIPTION

Figure 1:
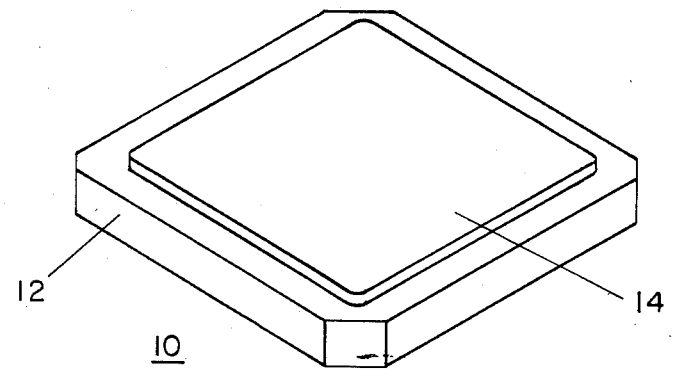
FIGS. 1 and 2 are perspective top and bottom views, respectively, of a known type of chip carrier.
Figure 2:
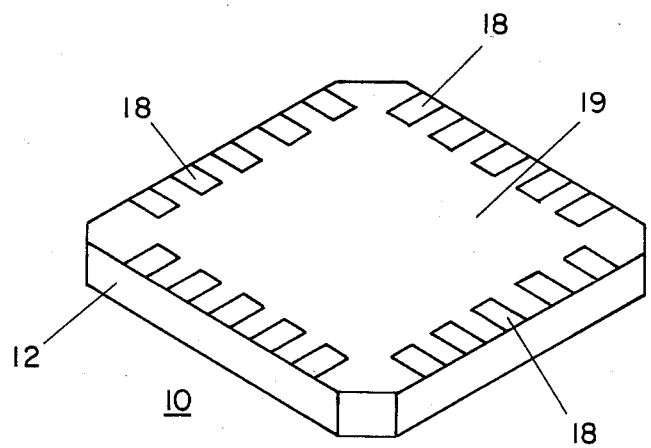

FIGS. 1 and 2 are isometric views of the top and the bottom, respectively, of a chip carrier 10. The chip carrier 10 is comprised of a body 12 containing a semiconductor integrated circuit chip (not shown) mounted within the body. A lid 14 is bonded to the top of the body 12 (FIG. 1) and the chip is electrically connected to pads 18—18 on the underside 19 (FIG. 2) thereof. As hereinbefore indicated it is necessary to apply solder to the pads 18—18 to provide an acceptable electrical bond to a metallized substrate (not shown) while maintaining a minimum distance between the substrate surface and the underside 19 of the chip carrier 10 to permit cleaning of the substrate surface and encapsulation of the carrier.

Figure 3:
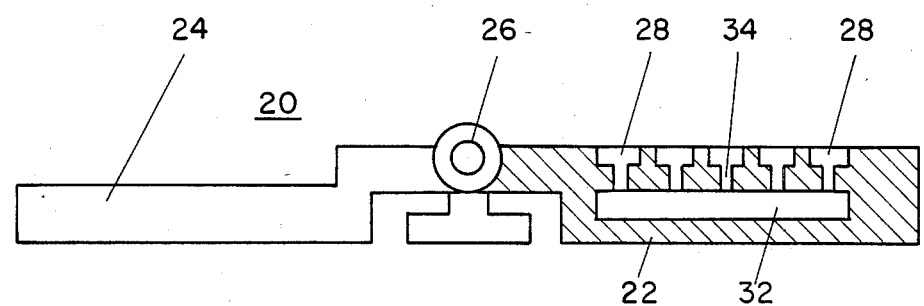
FIG. 3 is a partial cross-sectional view of handling apparatus used to implement the instant invention.
Figure 4:
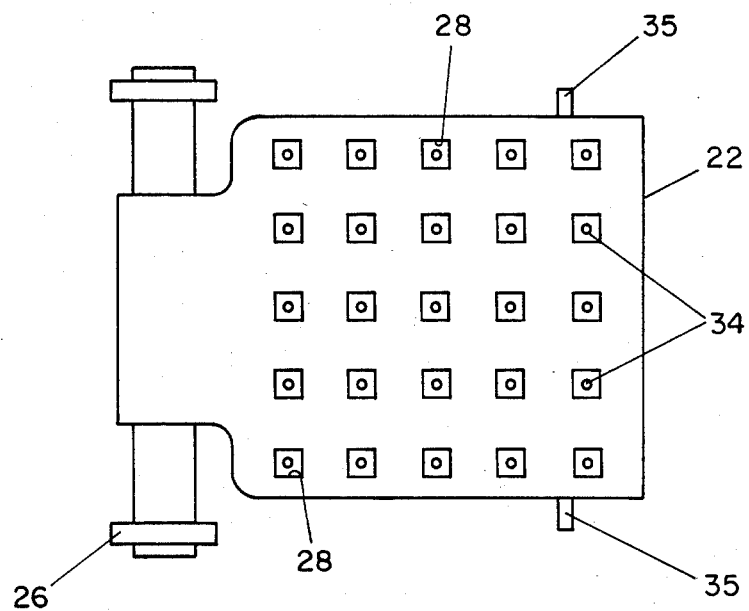
FIG. 4 is a plan view of a chip carrier holder.

FIG. 3 depicts a handling apparatus, generally referred to by the numeral 20, used to implement the instant invention. The apparatus 20 is comprised of a holder 22 rotatably connected to a base member 24 by a hinge 26. The holder 22 has an array of apertures 28—28 therein, each of which is connected to a chamber 32 via passageways 34—34. The chamber 32 is connected to a vacuum source (not shown). FIG. 4 is a plan view of the carrier 22 in which a handle 35 can be seen.

Figure 5:
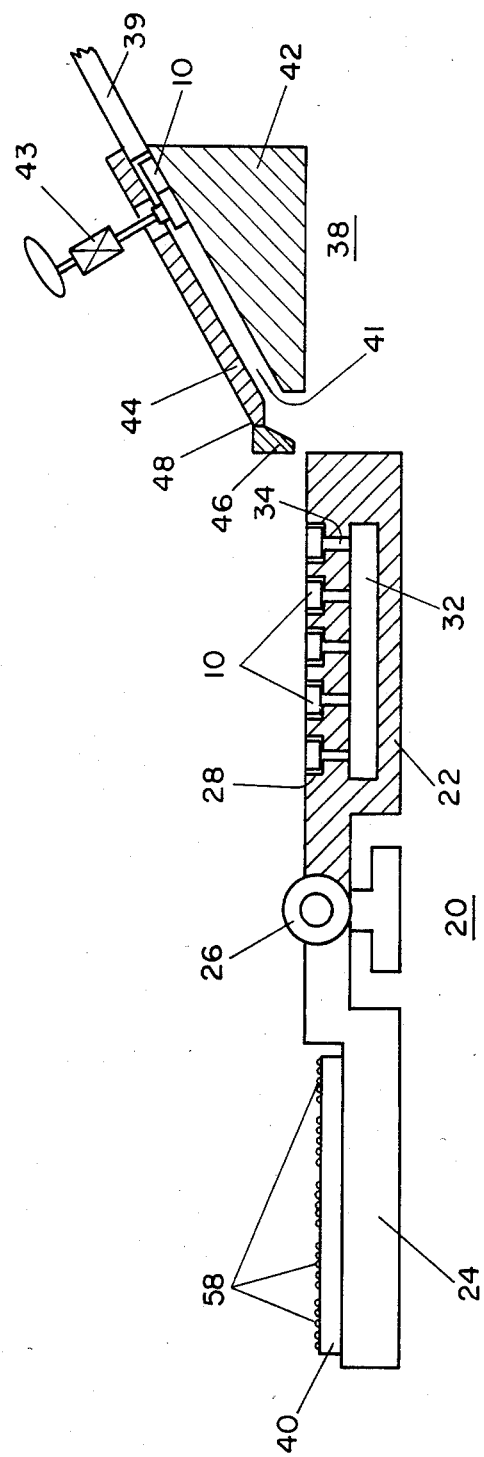
FIG. 5 is a partial cross-sectional view of the handling apparatus of FIG. 3 with chip carriers and a dimple plate thereon.

FIG. 5 shows a partial cross-sectional side view of the apparatus 20 with chip carriers 10—10 loaded into the apertures 28 and a dimple plate 40 positioned on the base member 24. The chip carriers 10—10 are dispensed into the appropriate cavities 28—28 by a dispensing apparatus 38 located proximate the holder 22. The carriers 10—10 are fed into the apparatus 38 from a hollow tube or stick 39.

Figure 6:
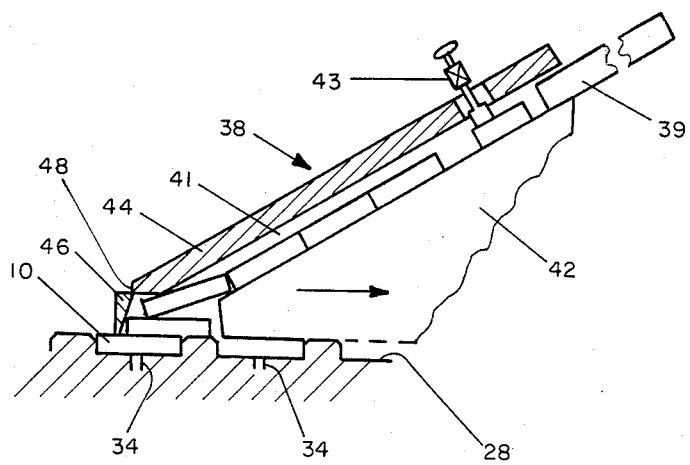
FIGS. 6 to 8 are schematic views of a chip carrier dispensing sequence.
Figure 7:
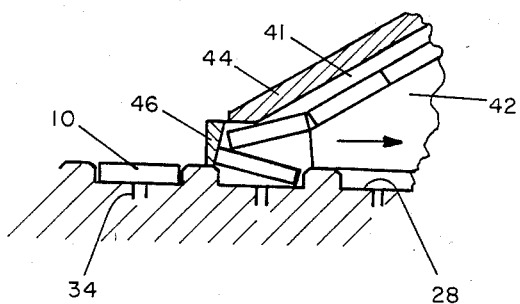
Figure 8:
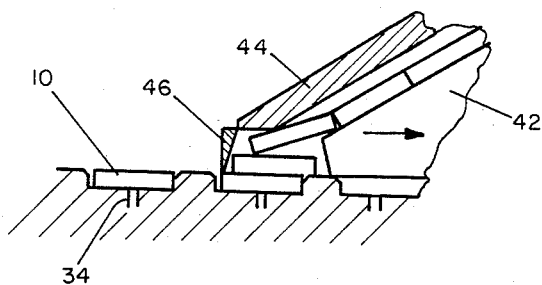

The dispensing technique sequence is shown in detail in FIGS. 6, 7 and 8. The chip carriers 10—10 are fed from the stick 39 into a channel 41 defined by a movable slide 42 and a slide cover 44. The movable slide 42 is positioned over the leftmost aperture 28 of the holder 22 as shown in FIG. 6. A push bar 46 is located proximate to one end 48 of the slide cover 44. A controllable plunger 43 may be activated to limit the number of chip carriers 10—10 that pass from the stick 39 into the channel 41. A chip carrier 10 will fall into the first vacant aperture 28 while a second chip carrier moves down the channel 41 and rests atop the first chip carrier. Continued movement of the apparatus 38 to the right causes the next chip carrier 10 to be moved into the next available aperture 28 by the push bar 42 as shown in FIG. 7. The next chip carrier 10 is dispensed from the channel 41 and is in position to be moved into the next available aperture 28 as shown in FIG. 8. The dispensing continues until the desired number of apertures 28 have been filled and the apparatus 38 is moved from the holder 22.

Figure 9:
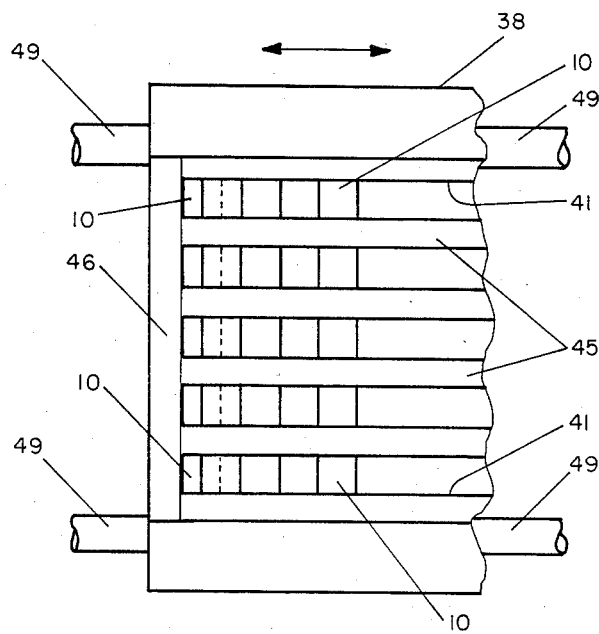
FIG. 9 is a top view of a chip carrier dispensing apparatus.

Although FIGS. 6 to 8 depict the sequential filling of a single row of cavities 28—28 with chip carriers 10—10, in an exemplary embodiment, a plurality of parallel rows of carriers, separated by members 45—45, may be dispensed to fill an array of apertures as shown in a partial top view of the dispensing apparatus 38 slidably mounted on rails 49—49 in FIG. 9.

Figure 10:
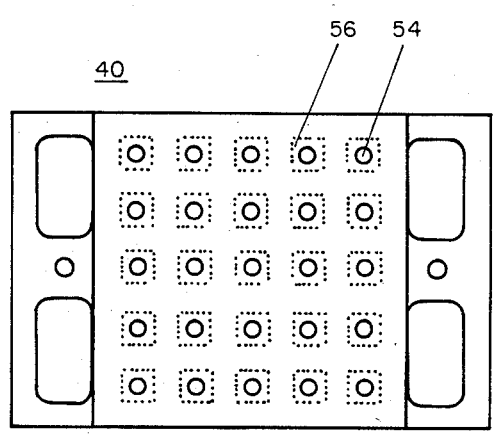
FIGS. 10 and 11 are plan views of the dimple plate.
Figure 11:
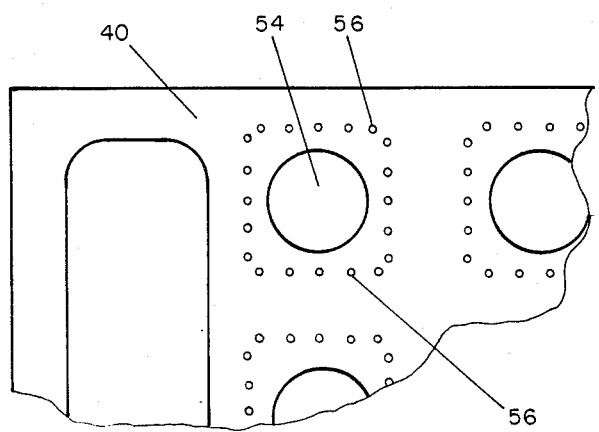
Figure 12:
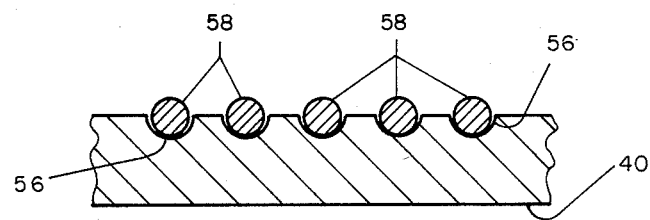
FIG. 12 is a partial cross-sectional view of the dimple plate with solder spheres positioned therein.

A plan view of the dimple plate 40 is shown in FIG. 10. The plate 40 has an array of holes 54 therethrough each of which is surrounded by a plurality of substantially hemispherically shaped indentations or dimples 56 as can best be seen in the partial plan view of FIG. 11 which is representative of a single chip carrier bonding site. FIG. 12 is a partial cross-sectional view through the dimple plate 40 showing a solder sphere 58 in each dimple 56. In an exemplary embodiment the solder spheres 58—58 are made of a 60/40 SnPb alloy. Solder flux may be required to obtain adequate wetting of the pads 18—18. Such flux may be deposited on the preforms 58—58 or on the chip carriers 10—10.

Figure 13:
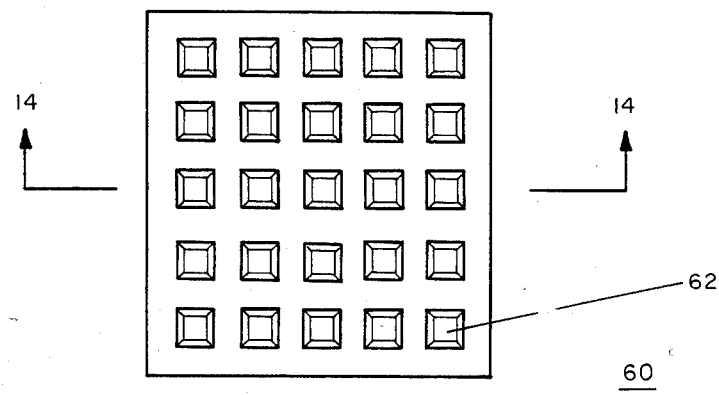
FIG. 13 is a plan view of a chip carrier locating template.
Figure 14:
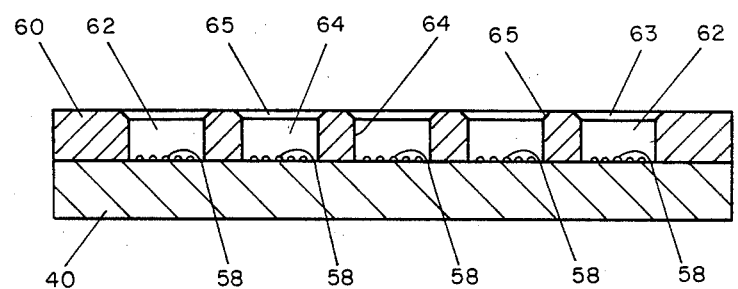
FIG. 14 is a cross-sectional view of the locating template positioned over the dimple plate.

A chip carrier locating template 60 is shown in a plan view of FIG. 13 and in cross section in FIG. 14 where it is aligned with and positioned on the dimple plate 40. The locating template 60 has an array of openings 62 therein in which the upper portion of the sides 64 have an inwardly tapered, or chamfered section 65.

Figure 15:
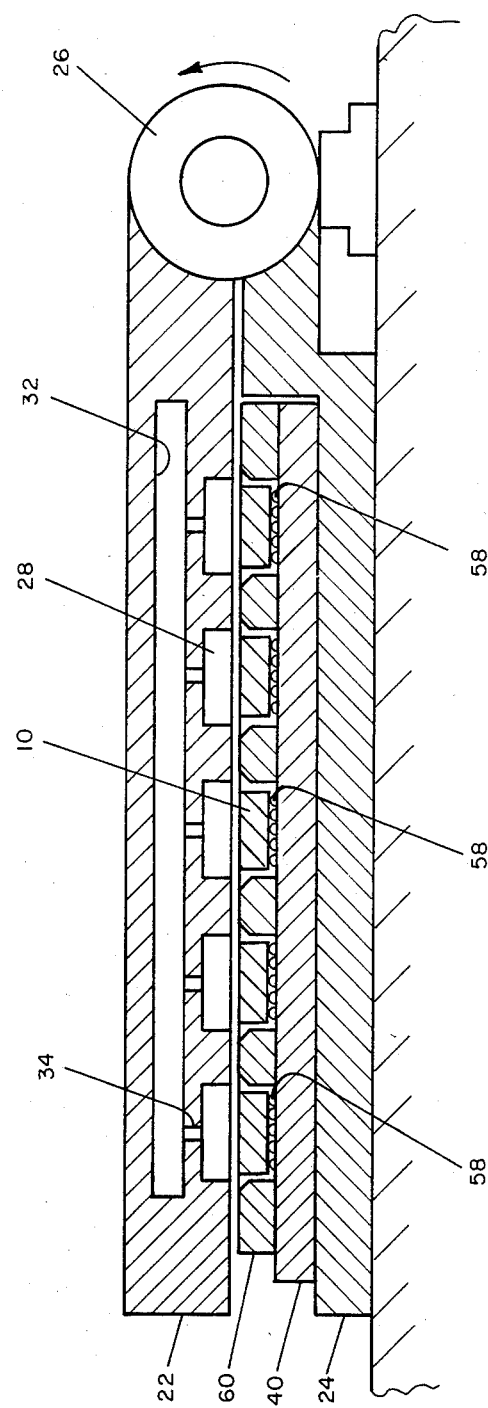
FIG. 15 is a cross-sectional view of the handling apparatus positioning chip carriers on solder spheres.

Once the template 60 is placed on the dimple plate 40, having a plurality of spheres 58 therein, a vacuum is applied to the chamber 32 of the holder 22 (see FIG. 5) to hold the chip carriers 10—10 securely in the apertures 28—28. The holder 22 is then rotated to position it on top of the locating template 60 as shown in FIG. 15. The vacuum to the chamber 32 is then removed which causes the chip carriers 10—10 to be released. The carriers 10—10 fall into, and are guided by, the tapered sections 65—65 of the sides 64 of the openings 62—62 to place each bonding pad 18 in contact with, or very close to, a solder sphere 58. The holder 22 is then rotated clockwise to its original position and the locating template 60 and the dimple plate 40 removed from the base member 24 and placed in a diffuse IR furnace or other similar apparatus. The solder spheres 58—58 are reflowed to form a solder bump 68 on each bonding pad 18—18. Advantageously, as the solder reflows the chip carrier 10 will move slightly, due to surface tension, to self-align the pads 18—18 to the spheres 58—58.

Figure 16:
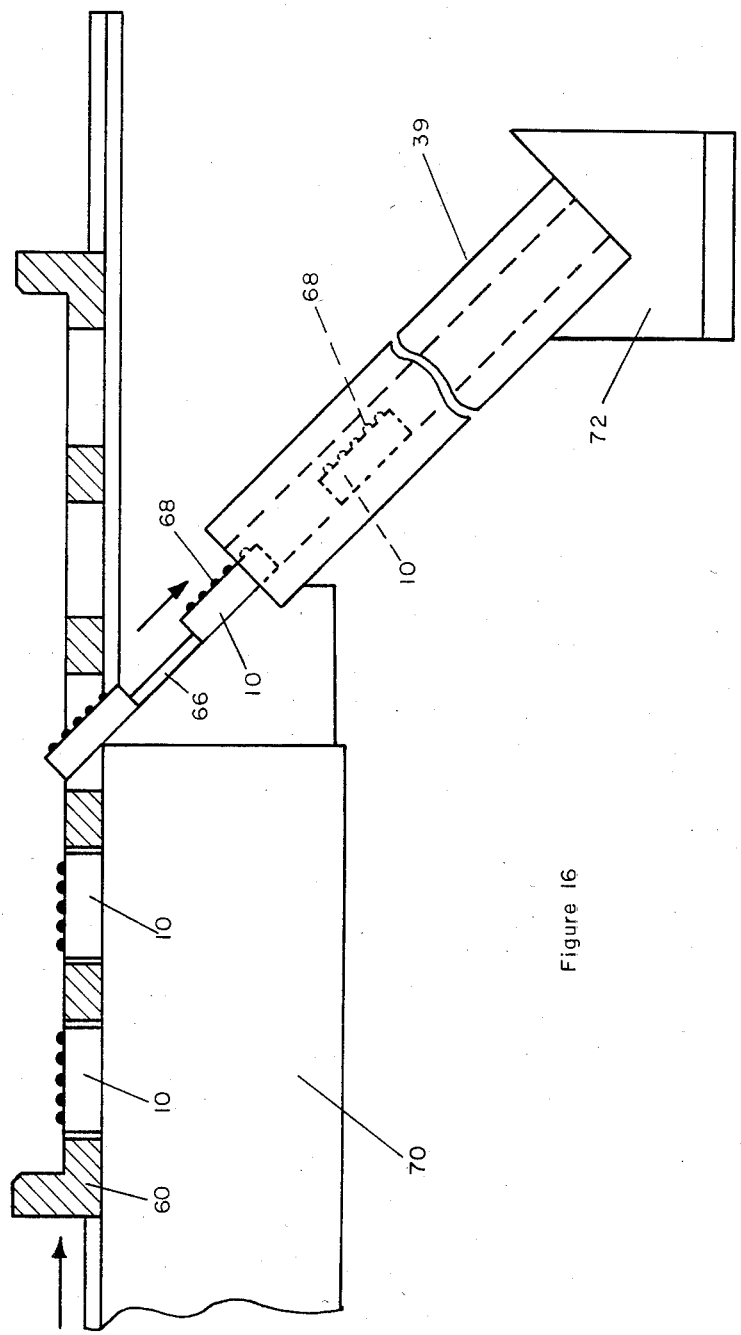
FIG. 16 is a schematic view of a chip carrier unloading apparatus.

After the template 60 and the dimple plate 40 are removed from the furnace and cooled, they are inverted on a base 70 (see FIG. 16). The chip carriers 10—10 tend to stick to the dimple plate 40, however they may be dislodged by pushing a "bed of nails" or the like through the openings 54—54 of the dimple plate. The bed of nails contacts the chip carriers 10—10 and pushes them into the openings 62—62 of the template 60.

The dimple plate 40 is then removed, exposing the array of chip carriers 10—10 with the solder bumps 68—68 projecting upward, as shown in FIG. 16. The array of chip carriers 10—10 may be inspected at this time and defective carriers replaced with acceptable product. The locating template 60 is then moved along guideways (not shown) where the chip carriers 10—10 fall from the openings 62—62 into a channel member 66 which guides the carriers into a hollow, elongated, metal or plastic stick 39 mounted on a support 72. It should again be noted that FIG. 16 depicts the loading of a single row of chip carriers 10 into a stick 39. In practice, a plurality of parallel rows, which form the array of chip carriers 10, may be simultaneously unloaded into a plurality of parallel sticks 39—39.

It is to be understood that the embodiments described herein are merely illustrative of the principles of the invention. Various modifications may be made thereto by persons skilled in the art which will embody the principles of the invention and fall within the spirit and scope thereof.

For example, for the sake of exposition the solder "bumping" of a 5×5 matrix array of chip carriers 10—10 has been described. However, the instant invention can readily "solder bump" substantially larger arrays and is only limited by the capacity of the ancillary apparatus such as the furnace or the like.

What is claimed is:

1. A method of forming solder bumps on contact pads of chip carriers, the method comprising the steps of:
   dispensing a plurality of chip carriers into an array of cavities of a planar holder;
   applying a vacuum to hold said carriers in said cavities;
   positioning the holder, with the chip carriers held therein, proximate to a plate having a plurality of arrays of dimples therein, each dimple containing a solder preform;
   releasing the vacuum to place the pads in contact with the solder preforms; and
   heating the preforms to form a solder bump on each pad.

2. The method as set forth in claim 1 which comprises the additional step of:
   interposing a locating template, having a plurality of tapered openings therein between the holder and the plate, to guide the chip carriers from the holder onto the arrays of solder preform filled dimples.

3. The method as set forth in claim 2, comprising the further steps of:
   inverting the dimple plate with the locating plate thereon;
   placing the locating template on a substantially planar surface;
   dislodging the chip carriers from the dimple plate into the openings of the locating template;

sliding the locating template towards an edge of the planar surface where a plurality of hollow sticks is located; and continued sliding of the locating template to cause the chip carriers to fall, from the openings therein, into the hollow sticks.

4. The method as set forth in claim 1, wherein:
the planar holder is rotatably connected to the plate.

5. The method as set forth in claim 1, wherein:
dispensing is accomplished by sliding chip carriers along inclined channels which move across the surface of the planar holder to place a chip carrier on the surface of the plate; and pushing the chip carrier into a cavity.

6. A soldering apparatus for forming solder bumps on contact pads of chip carriers, comprising:
a plate having a plurality of arrays of dimples, each sized to receive a solder preform therein;
a planar holder having an array of cavities therein and rotatably connected to the plate;
means for dispensing a plurality of chip carriers in the cavities;
a vacuum means for holding the chip carriers in the cavities; and
means for releasing the vacuum to place the pads in contact with the solder preforms prior to heating the preforms to form a solder bump on each pad.

7. The apparatus set forth in claim 6, further comprising:
a locating plate, having a plurality of tapered openings, positioned between the holder and the plate to guide chip carriers from the holder onto the arrays of solder preform filled dimples.

8. The apparatus as set forth in claim 6, wherein the dispensing means is comprised of:
a body portion, having at least one inclined channel along which at least one chip carrier can slide, movable along the surface of the planar holder; and
a push bar located at an end of each channel to push a chip carrier, dispensed from the channel, along the the surface of the holder and into a cavity.

* * * * *